US011703980B2

(12) United States Patent
Ye (10) Patent No.: US 11,703,980 B2
(45) Date of Patent: Jul. 18, 2023

(54) TOUCH DISPLAY DEVICE (71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 389 days.

(21) Appl. No.: 17/254,272

(22) PCT Filed: Sep. 18, 2020

(86) PCT No.: PCT/CN2020/116039
§ 371 (c)(1),
(2) Date: Dec. 19, 2020

(87) PCT Pub. No.: WO2022/021580
PCT Pub. Date: Feb. 3, 2022

(65) Prior Publication Data
US 2022/0317851 A1  Oct. 6, 2022

(30) Foreign Application Priority Data
Jul. 27, 2020  (CN) .......................... 202010728501.7

(51) Int. Cl.
*G06F 3/041* (2006.01)
*H10K 50/844* (2023.01)
(Continued)

(52) U.S. Cl.
CPC ........ *G06F 3/04166* (2019.05); *G06F 3/0412* (2013.01); *H10K 50/844* (2023.02);
(Continued)

(58) Field of Classification Search
CPC .. G06F 3/0412; G06F 3/04166; G06F 3/0443; G06F 3/0446; G06F 3/0448
See application file for complete search history.

(56) References Cited

U.S. PATENT DOCUMENTS

| 10,503,294 | B2 | 12/2019 | Kim | |
|---|---|---|---|---|
| 2010/0156840 | A1* | 6/2010 | Frey | ........................ C23F 1/02 345/174 |
| 2018/0348911 | A1 | 12/2018 | Lee et al. | |

FOREIGN PATENT DOCUMENTS

| CN | 103294293 A | 9/2013 |
|---|---|---|
| CN | 103384870 A | 11/2013 |

(Continued)

OTHER PUBLICATIONS

International Search Report in International application No. PCT/CN2020/116039, dated Apr. 29, 2021.
(Continued)

*Primary Examiner* — Robin J Mishler
(74) *Attorney, Agent, or Firm* — PV IP PC; Wei Te Chung; Zhigang Ma (57) ABSTRACT The present invention provides a touch display device, touch display device includes an organic light emitting diodes display panel and a touch layer. The organic light emitting diodes display panel includes common cathode and an encapsulation layer. The encapsulation layer is located between the common cathode and the touch layer. The touch layer includes touch units arranged in an array, each of the touch units is constituted by metal meshes. In each of the touch units, a percentage of a metal area of the metal meshes
(Continued)

to an area of each of the touch units is greater than 0% and is less than or equal to 25%.

16 Claims, 9 Drawing Sheets

(51) Int. Cl.
  *H10K 59/40*  (2023.01)
  *G06F 3/044*  (2006.01)
(52) U.S. Cl.
  CPC .......... *H10K 59/40* (2023.02); *G06F 3/0443* (2019.05); *G06F 3/0446* (2019.05)

(56) References Cited

FOREIGN PATENT DOCUMENTS

| CN | 103713785 | A | 4/2014 |
|----|-----------|---|--------|
| CN | 203746036 | U | 7/2014 |
| CN | 105830000 | A | 8/2016 |
| CN | 108073335 | A | 5/2018 |
| CN | 108803953 | A | 11/2018 |
| CN | 110007808 | A | 7/2019 |
| CN | 110502141 | A | 11/2019 |
| CN | 110865737 | A | 3/2020 |
| CN | 111065994 | A | 4/2020 |
| CN | 111596805 | A | 8/2020 |
| JP | 2015097039 | A | 5/2015 |
| KR | 20140016630 | A | 2/2014 |

OTHER PUBLICATIONS

Written Opinion of the International Searching Authority in International application No. PCT/CN2020/116039, dated Apr. 29, 2021.
Chinese Office Action issued in corresponding Chinese Patent Application No. 202010728501.7 dated Sep. 3, 2020, pp. 1-8.

* cited by examiner

TOUCH DISPLAY DEVICE

RELATED APPLICATIONS

This application is a Notional Phase of PCT Patent Application No. PCT/CN2020/116039 having international filing date of Sep. 18, 2020, which claims the benefit of priority of Chinese Patent Application No. 202010728501.7 filed on Jul. 27, 2020. The contents of the above applications are all incorporated by reference as if fully set forth herein in their entirety.

FIELD OF INVENTION

The present invention relates to a field of touch technologies, especially relates to a touch display device.

BACKGROUND OF INVENTION

A capacitance type touch screen, characterized in high durability, long lifespan, and support of multi-touch function, is applied extensively in various electrical interaction devices. For a capacitance type touch screen, the higher the touch report rate is, the smoother a user's operation is. On the contrary, the lower the touch report rate is, the worse the touch operation is.

Therefore, it is necessary to provide a technical solution to improve a touch report rate of a touch display device.

SUMMARY OF INVENTION

Technical Issue

An objective of the present invention is to provide a touch display device to enhance a touch report rate of the touch display device.

Technical Solution

To achieve the above objective, the present invention provides a touch display device, the touch display device comprises an organic light emitting diodes display panel and a touch assembly, the organic light emitting diodes display panel comprises a common cathode and an encapsulation layer, the touch assembly comprises a touch layer, the encapsulation layer is located between the common cathode and the touch layer, the touch layer comprises a plurality of touch units arranged in an array, each of the touch units is constituted by metal meshes, in each of the touch units, a percentage of a metal area of the metal meshes to an area of each of the touch units is greater than 0% and is less than or equal to 25%.

In the above touch display device, in each of the touch units, a percentage of a metal area of the metal meshes to an area of each of the touch units is greater than or equal to 10% and is less than or equal to 22%.

In the above touch display device, each of the touch units comprises a driver electrode and induction electrodes, the driver electrode is electrically insulated from the induction electrodes,
in each of the touch units, a percentage of a metal area of the driver electrode to a metal area of each of the touch units is less than a percentage of a metal area of the induction electrodes to the metal area of each of the touch units.

In the above touch display device, each of the touch units further comprises a floating electrode, the floating electrode is electrically insulated from both the driver electrode and the induction electrodes, the floating electrode is dispose in the driver electrode and/or the induction electrodes, and/or, the floating electrode is disposed between the driver electrode and the induction electrodes,
a percentage of a metal area of the floating electrode to the metal area of each of the touch units is less than a percentage of a metal area of the driver electrode to the metal area of each of the touch units.

In the above touch display device, in each of the touch units,
a percentage of a metal area of the driver electrode to the metal area of each of the touch units is greater than 0% and is less than or equal to 60%;
a percentage of a metal area of the induction electrodes to the metal area of each of the touch units is greater than or equal to 40% and is less than 100%;
a percentage of a metal area of the floating electrode to the metal area of each of the touch units is greater than or equal to 0% and is less than or equal to 25%.

In the above touch display device, in each of the touch units,
a percentage of a metal area of the driver electrode to the metal area of each of the touch units is greater than or equal to 25% and is less than or equal to 55%;
a percentage of the metal area of the induction electrodes to the metal area of each of the touch units is greater than or equal to 40% and is less than or equal to 70%;
a percentage of a metal area of the floating electrode to the metal area of each of the touch units is greater than or equal to 5% and is less than or equal to 25%.

In the above touch display device, in each of the touch units, a metal area of the floating electrode disposed between the driver electrode and the induction electrodes is less than a metal area of the floating electrode disposed in the driver electrode and/or in the induction electrodes.

In the above touch display device, the driver electrode comprises first trunk electrodes extending along a first direction and first branch electrodes extending out from the first trunk electrodes,
in each of the touch units, a ratio of a metal area of the first trunk electrodes to a metal area of the first branch electrodes is 1/2 to 2; and/or
each of the induction electrodes comprises a second trunk electrode extending along a second direction and second branch electrodes extending out from the second trunk electrode,
in each of the touch units, a ratio of a metal area of the second trunk electrodes to a metal area of the second branch electrodes is 1/2 to 2, and the first direction is different from the second direction.

In the above touch display device, in each of the touch units, a capacitance variation of a mutual capacitance of a node between the driver electrode and the induction electrodes is greater than or equal to 40 femtofarads.

In the above touch display device, in each of the touch units, a time required for a mutual capacitance of a node between the driver electrode and the induction electrodes charged to reach a predetermined voltage is less than or equal to a predetermined duration.

In the above touch display device, the touch assembly further comprises a touch chip, the touch chip is electrically connected to the driver electrode and the induction electrodes, and the touch chip is configured to input an input voltage into the driver electrode; and a percentage of the predetermined voltage to the input voltage 90%-99%, the predetermined duration is 1 microsecond to 2 microseconds.

In the above touch display device, a percentage of the predetermined voltage to the input voltage 95%.

In the above touch display device, a distance between the touch layer and the common cathode is greater than or equal to 5 microns and is less than or equal to 15 microns.

In the above touch display device, a distance between the touch layer and the common cathode is greater than or equal to 8 microns and is less than or equal to 12 microns.

In the above touch display device, each of the touch units is a square, a side length of each of the touch units is greater than or equal to 3.5 millimeters and is less than or equal to 4.5 millimeters.

Advantages

The present invention provides a touch display device, the touch display device comprises an organic light emitting diodes display panel and a touch assembly. The organic light emitting diodes display panel comprises a common cathode and an encapsulation layer. The touch assembly comprises a touch layer, an encapsulation layer is located between the common cathode and the touch layer. The touch layer comprises a plurality of touch units arranged in an array, each of the touch units is constituted by metal meshes. In each of the touch units, a percentage of a metal area of the metal meshes to an area of each of the touch units is greater than 0% and is less than or equal to 25%. By preferably selecting a percentage of the metal area of the metal meshes in each of the touch units, a parasitic capacitance between each of the touch units and the common cathode is reduced to improve a touch report rate of the touch display device.

DETAILED DESCRIPTION OF PREFERRED EMBODIMENTS

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

The present invention provides a touch display device, the touch display device comprises an organic light emitting diodes display panel and a touch assembly. The organic light emitting diodes display panel comprises a common cathode and an encapsulation layer. The touch assembly comprises a touch layer. The encapsulation layer is located between the common cathode and the touch layer. The touch layer comprises a plurality of touch units arranged in an array, and each of the touch units is constituted by metal meshes.

In each of the touch units, a percentage of a metal area of the metal meshes to an area of each of the touch units is greater than 0% and is less than or equal to 25%. Controlling the percentage of the metal area of each of the touch units and the area of each the touch units to be greater than 0% and be less than or equal to 25%, prevents the metal area in the touch units from being large to result in a large parasitic capacitance of the touch units. For example, a percentage of the metal area of the metal meshes in each of the touch units to the area of each of the touch units is 2%, 4%, 6%, 8%, 10%, 12%, 14%, 16%, 18%, 20%, 22%, and 24%. The metal area of the metal meshes can be increased or decreased by adjusting a wire width of metal wires of the metal meshes.

In some embodiments, in each of the touch units, a percentage of a metal area of the metal meshes to an area of each of the touch units is greater than or equal to 10% and is less than or equal to 22% to guarantee that a parasitic capacitance corresponding to the metal area of each of the touch units is greater while a sufficient metal area of each of the touch units is ensured, which guarantees a sufficient capacitance sensing amount of each of the touch units as required and prevents an effective area of the metal meshes from being further decreased on the basis of the hollow touch electrode of metal meshes with a smaller effective area of the touch electrode and resulting in a reduced capacitance sensing amount unable to fulfil essential requirement.

In some embodiments, each of the touch units comprises a driver electrode and induction electrodes, the driver electrode is electrically insulated from the induction electrodes. In each of the touch units, a percentage of a metal area of the driver electrode to the metal area of each of the touch units is less than a percentage of the metal area of the induction electrodes to the metal area of each of the touch units. Because a parasitic capacitance between the driver electrode and the common cathode is less than a parasitic capacitance between the induction electrodes and the common cathode, the parasitic capacitance of the driver electrode channel is maintained smaller, and the touch chip inputs a scan signal into the driver electrode, the smaller parasitic capacitance of the driver electrode advantages improving a scan frequency outputted by the touch chip to the driver electrode, and therefore advantages lowering a 3RC time constant of a node mutual capacitance of a longest time required for charging in the touch screen to 95% of an input voltage, which advantages improving the touch report rate of the touch screen.

In some embodiments, each of the touch units further comprises a floating electrode (dummy electrode). The floating electrode is electrically insulated from the driver electrode and the induction electrodes, the floating electrode is disposed in the driver electrode and/or the induction electrodes, and/or the floating electrode is disposed between the driver electrode and the induction electrodes.

In each of the touch units, a percentage of a metal area of the floating electrode to a metal area of each of the touch units is less than a percentage of a metal area of the driver electrode to a metal area of each of the touch units.

In each of the touch units, the metal area of the floating electrode being less than the metal area of the driver electrode cano prevent the greater metal area of the floating electrode from resulting in a less area of the driver electrode and the induction electrodes to cause the issue of a mutual capacitance between the driver electrode and the induction electrodes.

In some embodiments, in each of the touch units, a percentage of the metal area of the driver electrode to the metal area of each of the touch units is greater than 0% and is less than or equal to 60%;
- a percentage of the metal area of the induction electrodes to the metal area of each of the touch units is greater than or equal to 40% and is less than 100%;
- a percentage of a metal area of the floating electrode to the metal area of each of the touch units is greater than or equal to 0% and is less than or equal to 25%.

A ratio of the effective metal of the driver electrode to the effective metal of the induction electrodes, while guaranteeing the sufficient variation amount of the touch signal, guarantees that a resistive-capacitive delay of the driver electrode channels formed by the driver electrodes is kept in a comparatively low value to advantage reducing and keeping a node mutual capacitance in the touch panel in a comparatively low value. Control of a ratio of the floating electrode, while effectively reducing a parasitic capacitance between the driver electrode and induction electrodes, and the cathode, guarantees an area of an effective metal electrode of the driver electrode and the induction electrodes to ensure a mutual capacitance formed between the driver electrode and the induction electrodes, and guarantees a mutual capacitance variation between the driver electrode and the induction electrodes, which facilitates detection of a touch signal variation amount by the touch chip, and simultaneously facilitates improvement of touch sensitivity. An over large floating electrode area in a single touch unit results in issues of reduction of the effective electrode area between the driver electrode and the induction electrodes and a corresponding small mutual capacitance between driver electrode and the induction electrodes.

In some embodiments, in each of the touch units, a percentage of the metal area of the driver electrode to the metal area of each of the touch units is greater than or equal to 25% and is less than or equal to 55%;
- a percentage of the metal area of the induction electrodes to the metal area of each of the touch units is greater than or equal to 40% and is less than or equal to 70%;
- a percentage of a metal area of the floating electrode to the metal area of each of the touch units is greater than or equal to 5% and is less than or equal to 25%.

Specifically, in each of the touch units, a percentage of the metal area of the driver electrode to the metal area of each of the touch units can be 5%, 8%, 10%, 12%, 15%, 17%, 22%, 24%, 28%, 30%, 32%, 34%, 36%, 38%, 40%, 45%, 50%, 52%, 55%, or 58%. In each of the touch units, a percentage of the metal area of the induction electrodes to the metal area of each of the touch units can be 42%, 44%, 46%, 48%, 52%, 54%, 55%, 60%, 62%, 64%, 66%, 68%, 70%, 72%, 76%, or 80%. In each of the touch units, a percentage of the metal area of the floating electrode to the metal area of each of the touch units is 2%, 4%, 6%, 8%, 10%, 12%, 14%, 16%, 18%, 20%, 22%, or 24%.

In some embodiments, in each of the touch units, a metal area of a floating electrode disposed between the driver electrode and the induction electrodes is less than a metal area of the floating electrode disposed in the driver electrode and/or induction electrodes such that the area of the driver electrode and/or induction electrodes is reduced while a parasitic capacitance of the driver electrode and/or induction electrodes is reduced to prevent excessing of the floating electrode between the driver electrode and the induction electrodes resulting in a lowered mutual capacitance between intersection portions between the driver electrode and the induction electrodes.

In some embodiments, the driver electrode comprises first trunk electrodes extending along a first direction and first branch electrodes extending out from the first trunk electrodes;
- in each of the touch units, a ratio of a metal area of the first trunk electrodes to a metal area of the first branch electrodes is 1/2 to 2; and/or,
- each of the induction electrodes comprises a second trunk electrode extending along a second direction and second branch electrodes extending out from the second trunk electrode. In each of the touch units, a ratio of a metal area of the second trunk electrodes to a metal area of the second branch electrodes is 1/2 to 2, and the first direction is different from the second direction. By controlling a ratio of the metal area of the trunk electrode and branch electrode of at least one of the driver electrode and the induction electrodes in each of the touch units, a resistance of the trunk electrodes is lowered while a mutual capacitance between the branch electrodes is guaranteed. An over large ratio of the branch electrodes would result in a smaller ratio of the trunk electrodes to cause a greater impedance of the trunk electrodes to disadvantage electrical signal transmission, which disadvantages improvement of the touch report rate. An over large ratio of the trunk electrodes would result in a smaller ratio of the branch electrodes to cause a smaller mutual capacitance between the branch electrode, which disadvantages improvement of touch precision.

Specifically, in each of the touch units, a ratio of a metal area of the first trunk electrodes to a metal area of the first branch electrodes can be 1/2, 2/3, 1, 5/4, 3/2, or 2. in each of the touch units, a ratio of a metal area of the second trunk electrodes to a metal area of the second branch electrodes can be 1/2, 2/3, 1, 5/4, 3/2, or 2.

In some embodiments, in each of the touch units, a capacitance variation of a mutual capacitance of a node between the driver electrode and the induction electrodes is greater than or equal to 40 femtofarads, which advantages of the touch chip detecting a variation amount of a touch signal and also advantages enhancement of sensitivity of touch.

In some embodiments, in each of the touch units, a time required for a mutual capacitance of a node between the driver electrode and the induction electrodes charged to reach a predetermined voltage is less than or equal to a predetermined duration.

In some embodiments, touch assembly further comprises a touch chip, the touch chip is electrically connected to the driver electrode and the induction electrodes, and the touch chip is configured to input an input voltage into the driver electrode; and a percentage of the predetermined voltage to the input voltage 90%-99%, the predetermined duration is 1 microsecond to 2 microseconds.

Specifically, a percentage of the predetermined voltage to the input voltage is 95%. the percentage of the predetermined voltage to the input voltage can also be 96%, 98%, 97%, or 90%. The predetermined duration can be 1 microsecond, 1.2 microsecond, 1.22 microsecond, 1.3 microsecond, 1.35 microsecond, 1.4 microsecond, 1.5 microsecond, or 1.6 microsecond.

In some embodiments, a distance between the touch layer and the common cathode is greater than or equal to 5 microns and is less than or equal to 15 microns such that the interval between the metal of the touch units of the touch layer and the common cathode is greater to make a parasitic capacitance between the metal of the touch units and the common cathode smaller.

In some embodiments, a distance between the touch layer and the common cathode is greater than or equal to 8 microns and is less than or equal to 12 microns to further increase the interval between the metal of the touch units and the common cathode to further reduce the parasitic capacitance between the metal of the touch units and the common cathode.

Specifically, the distance between the touch layer and the common cathode can be 6 microns, 8 microns, 9 microns, 10 microns, 11 microns, 12 microns, or 14 microns.

In some embodiments, each of the touch units is a square, a side length of each of the touch units is greater than or equal to 3.5 millimeters and is less than or equal to 4.5 millimeters. For example the side length is 3.6 millimeters, 3.7 millimeters, 3.8 millimeters, or 4.0 millimeters. The touch units serves as a functional unit configured to a touch position which a finger touches. Over large sizes of the touch units would disadvantage enhancement of touch precision.

Several concepts in the present invention will be elaborated on as follows.

The node mutual capacitance: in each of the touch units, the driver electrode and the induction electrodes form a node mutual capacitance, the node mutual capacitance comprises a mutual capacitance formed on a boundary between the driver electrode and the induction electrodes and a basic capacitance formed on an overlapping portion between the driver electrode and the induction electrodes. Generally, the mutual capacitance on the boundary between the driver electrode and the induction electrodes should be controlled in an adequate range for guaranteeing a touch signal amount to improve touch performance such as touch sensitivity. The smaller the basic capacitance formed on an overlapping portion between the driver electrode and the induction electrodes, the higher touch report rate is raised.

3RC Settling time (3RC time constant) is a time constant for an output signal reaching 95% of an input signal. The time constant is determined by amount and distribution of a resistance and a capacitance of the screen body of the touch screen itself. The input signal is a voltage outputted from the touch chip to the driver electrode, the output signal is a voltage written on a node mutual capacitance. When a design of the screen body of the touch screen is determined, a 3RC time constant of each node mutual capacitance on the screen body of the touch screen is determined. Usually, if a node mutual capacitance of the longest time required for the node mutual capacitance on the screen body of the touch screen charged to reach 95% of the input signal fulfill a predetermined 3RC time constant, other signal of the node mutual capacitance will also fulfill the predetermined 3RC time constant. Therefore, a report rate of the touch screen is usually determined by a 3RC time constant of the node mutual capacitance of the longest time required for the node mutual capacitance of the screen body charged to reach 95% of the input signal.

The floating electrode: the floating electrode would not load electrical signals, and is electrically insulated from the driver electrode and the induction electrodes. The floating electrode is located in the same layer with the induction electrodes and the driver electrode, and each of the floating electrode, the driver electrode and the induction electrodes is constituted by the metal meshes. Functions of the floating electrode comprises electrically insulating the driver electrode from the induction electrodes and improving uniformity of light passing through the touch layer.

The above solution is described in details accompanying with specific embodiments as follows.

First Embodiment

Figure 1:
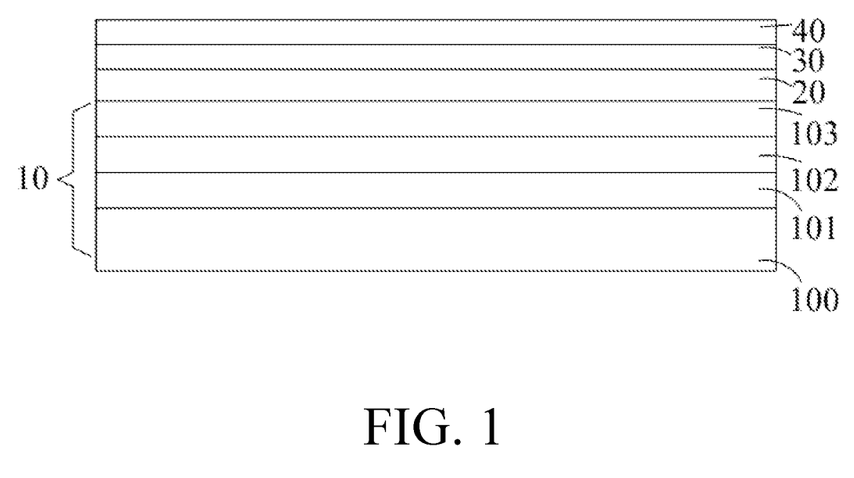
FIG. 1 is a schematic view of a touch display device of the present invention.

With reference to FIG. 1, FIG. 1 is a schematic view of a touch display device of the present invention. The touch display device comprises an organic light emitting diodes display panel 10, a touch layer 20, a polarizer 30, and a protective cover lid 40.

The organic light emitting diodes display panel 10 comprises a substrate 100, a thin film transistors array layer 101, an organic light emitting diode array layer 102, and an encapsulation layer 103.

The substrate 100 is a flexible substrate. The thin film transistors array layer 101 is disposed on the substrate 100, the thin film transistors array layer 101 comprises a plurality of thin film transistors arranged in an array. The organic light emitting diode array layer 102 is disposed on a side of the thin film transistors array layer 101 away from the substrate 100. The organic light emitting diode array layer 102 comprises a plurality of organic light emitting diodes arranged in an array, the organic light emitting diodes comprise a plurality of independent anodes, an organic light emitting layer disposed on each of the anodes, and a common cathode. In other words, the organic light emitting diodes commonly employs one common cathode. Each of the organic light emitting diodes constitutes a sub-pixel. The sub-pixels comprise red sub-pixels, blue sub-pixels, and green sub-pixels. The encapsulation layer 103 is configured to protect the organic layer and the common cathode in the organic light emitting diode array layer 102 to prevent the organic layer and the common cathode from erosion of water vapor and oxygen. The encapsulation layer 103 is disposed on a side of the organic light emitting diode array layer 102 away from the thin film transistors array layer 101. The encapsulation layer 103 can be a thin film encapsulation layer. The thin film encapsulation layer comprises two inorganic layers and an organic layer disposed between the two inorganic layers.

Figure 2:
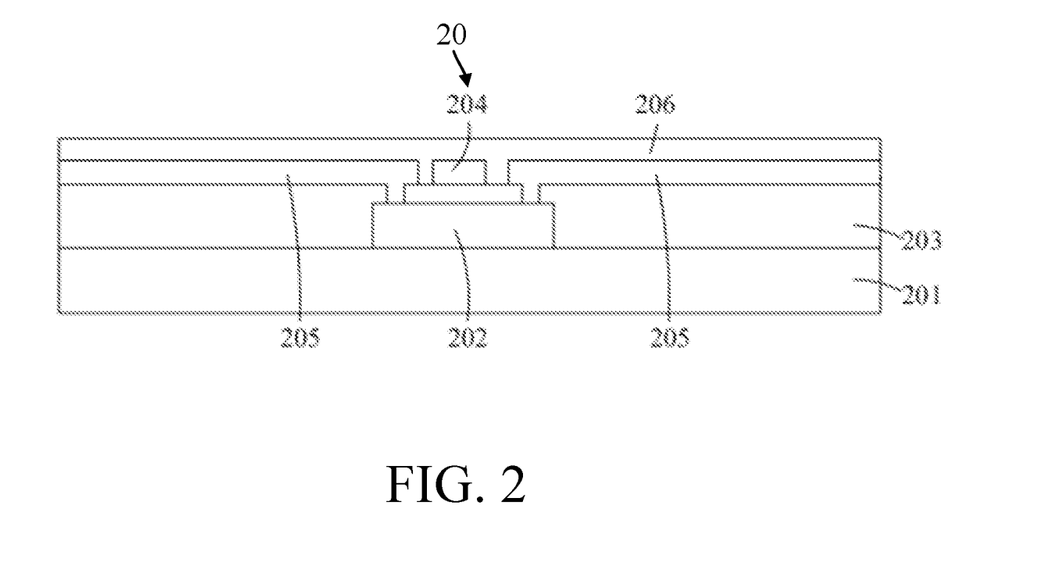
FIG. 2 is a schematic view of the touch layer shown in FIG. 1.

With reference to FIG. 2, FIG. 2 is a schematic view of the touch layer shown in FIG. 1. The touch layer 20 comprises a buffer layer 201, a second connection portion 202, a first passivation layer 203, a driver electrode 204, induction electrodes 205, and a second passivation layer 206. The buffer layer 201 is an insulation layer, a manufacturing material of the buffer layer 201 is selected from at least one of silicon nitride and silicon oxide. The second connection portion 202 is disposed on the buffer layer 201. The second connection portion 202 is electrically conductive, the second connection portion 202 is two V-shaped bridge lines disposed at an interval, and each of the V-shaped bridge lines is constituted by metal meshes constituted by very few metal wires. The first passivation layer 203 covers the second connection portion 202 and the buffer layer 201. A manufacturing material of the first passivation layer 203 is selected from at least one of silicon nitride and silicon oxide. The driver electrode 204 and induction electrodes 205 are disposed on the first passivation layer 203, and the driver electrode 204 is electrically insulated from the induction electrodes 205, the driver electrode 204 is connected through a first connection portion (not shown). The driver electrode 204 is disposed on a same layer with the first connection portion and is formed continuously. The second passivation layer 206 covers the driver electrode 204 and the induction electrodes 205. The adjacent induction electrodes 205 are connected to each other through the second connection portion 202, each of the induction electrodes 205 is connected to the second connection portion 202 through a via hole of the first passivation layer 203.

In the present embodiment, the driver electrode 204, the induction electrodes 205, the second connection portion 202, and the first connection portion are assembled as a touch electrode. An overlapping portion between the second connection portion 202 and the driver electrode 204 forms the above basic capacitance. Each of the driver electrode 204, the induction electrodes 205, the second connection portion 202, and the first connection portion is constituted by the metal meshes. Each of the metal meshes surrounds each of the sub-pixels of the organic light emitting diode array layer to prevent shielding light of the sub-pixels.

Figure 3:
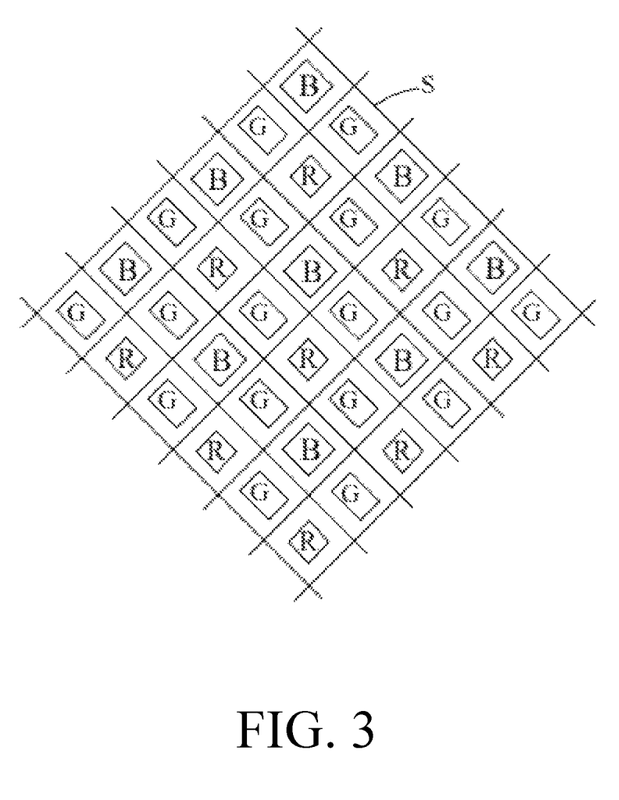
FIG. 3 is a schematic view of metal meshes surrounding sub-pixels.

With reference to FIG. 3, FIG. 3 is a schematic view of metal meshes surrounding sub-pixels. The metal meshes are constituted by metal wires S. R refers to a red sub-pixel, B refers to a blue sub-pixel, and G refers to a green sub-pixel. The metal wires S forming the metal meshes are disposed between adjacent two of the sub-pixels, each of the metal meshes surrounds one sub-pixel. A shape of each of the metal meshes is rhombus, a shape of the sub-pixel can be rhombus, square, rectangle. For example, one rhombus metal meshes surrounds one red sub-pixel R. In other embodiment, the shape of each of the metal meshes can be ellipse or other shape.

Figure 4:
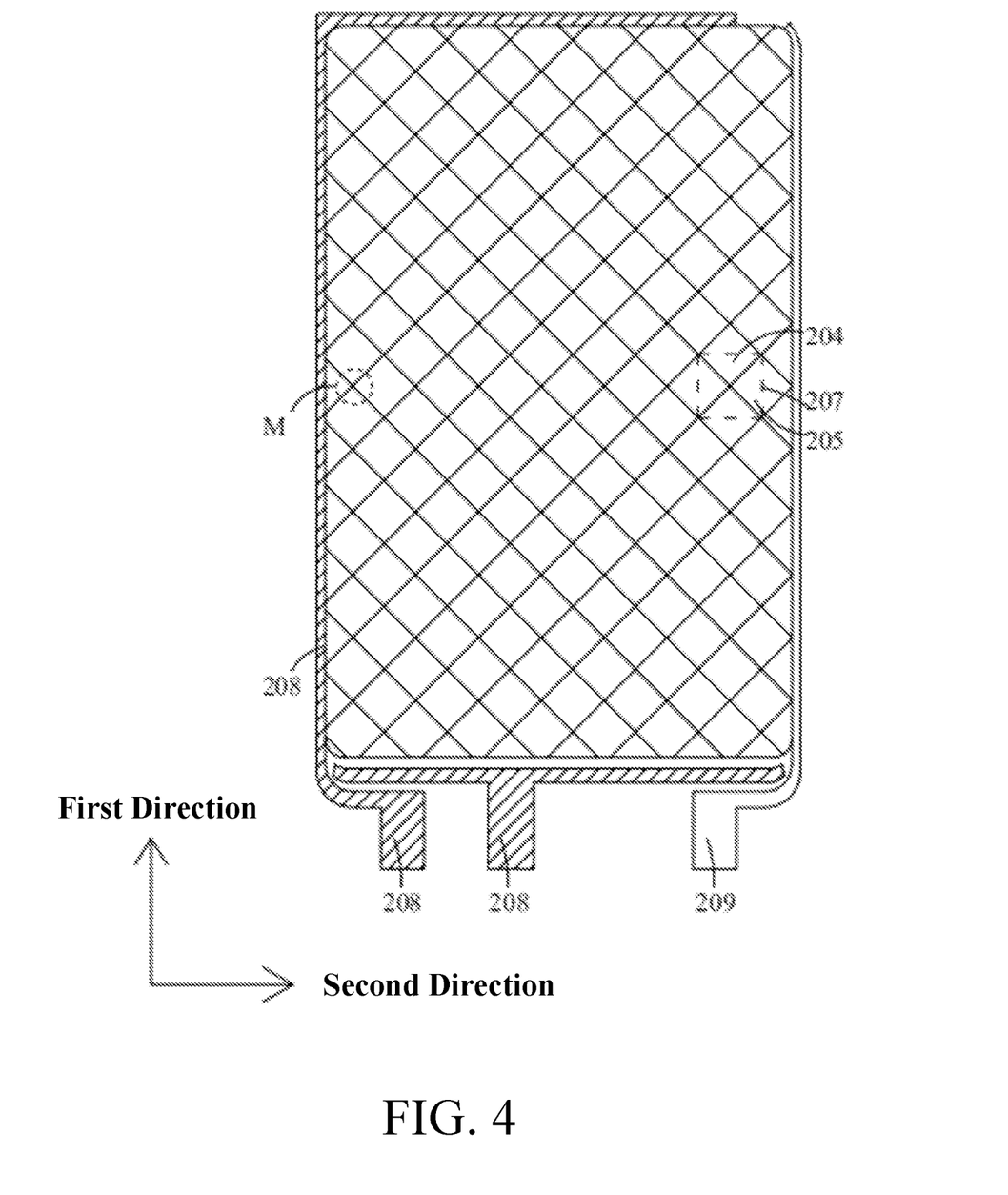
FIG. 4 is a framework diagram of a touch layer of the touch display device shown in FIG. 1.

With reference to FIG. 4, FIG. 4 is a framework diagram of a touch layer of the touch display device shown in FIG. 1. Driver electrodes 204 of a plurality of touch units 207 arranged in a column along a first direction are connected electrically to one another to form a driver electrode channel, and induction electrodes 205 of a plurality of touch units 207 arranged in a column along a second direction are connected electrically to one another to form induction electrodes channel. Two ends of each driver electrode channel are connected to a first lead wire 208, an end of each induction electrodes channel is connected to a second lead wire 209, namely the touch layer uses a 2T1R framework.

Seventeen driver electrode channels are in the second direction, thirty-seven induction electrodes channels are in the first direction, wherein the first to thirty-seventh induction electrodes channels are arranged sequentially and the thirty-seventh induction electrodes channel is farthest from the touch chip. The four adjacent driver electrode channels along the second direction are defined as a set for scan, for example, the first to fourth driver electrode channels are defined as a set for scan, the fifth to eighth driver electrode channels are defined as a set for scan, the ninth to twelfth driver electrode channels are defined as a set for scan, the thirteenth to sixteenth driver electrode channels are defined as a set for scan, a seventeenth driver electrode channel is defined as a set for scan. Each set of the driver electrode channel(s) is scanned four times, each scan inputs a set of waveforms. Each set of waveforms comprises forty-eight standard square waveforms, therefore a mutual capacitance scan time required for scanning an entire touch display device is 5×4×48×2×t, wherein a time corresponding to each standard square waveform is 2×t, t is the longest time required for the node mutual capacitance charged to 95% of an input voltage.

In the present embodiment, a node mutual capacitance M of the lonest time required for the touch layer charged to 95% of the input voltage is located at a middle of touch layer, for example, a node mutual capacitance of an intersection portion between the first driver electrode channel and the nineteenth induction electrodes channel.

It should be explained that, usually, a time consumption of one frame of touch comprises a self-capacitance scan time, a mutual capacitance scan time, a self-capacitance-mutual-capacitance switching time, and a reset time, the most part occupying the time consumption of one frame of touch is mutual capacitance scan time consumption. The self-capacitance-mutual-capacitance switching time and the reset time is usually determined by the touch chip. A time required by the mutual capacitance scan is usually determined by the 3RC time constant of the screen body itself under a condition in which the touch chip scan frequency is fulfilled. The mutual capacitance scan time consumption and the screen body mutual capacitance scan time mainly comprises N sets of mutual capacitance scan waveforms. A time of the N sets of mutual capacitance scan waveforms constitutes a scan time of the mutual capacitance. When a number of the channels of the screen body is determined, usually N is relevant to the number of the driver electrode channels of the screen body and driver groups of the driver electrode channels. The touch report rate is a reciprocal of a time consumption of one frame of touch (time unit is second).

Second Embodiment and Comparison Embodiment 1

Accompanying with the touch units of the embodiment and the comparison embodiment as follows, influence of the metal area of the touch units to the 3RC time constant, the mutual capacitance, and the capacitance variation are researched, and influence of ratios of metal areas of the driver electrode, the induction electrodes, and the floating electrode to the total metal area to the 3RC time constant, the mutual capacitance, and the capacitance variation are researched. The capacitance variation mainly affects touch sensitivity, the parasitic capacitance mainly affects the 3RC time constant, and 3RC time constant mainly affects the touch report rate.

Figure 5A:
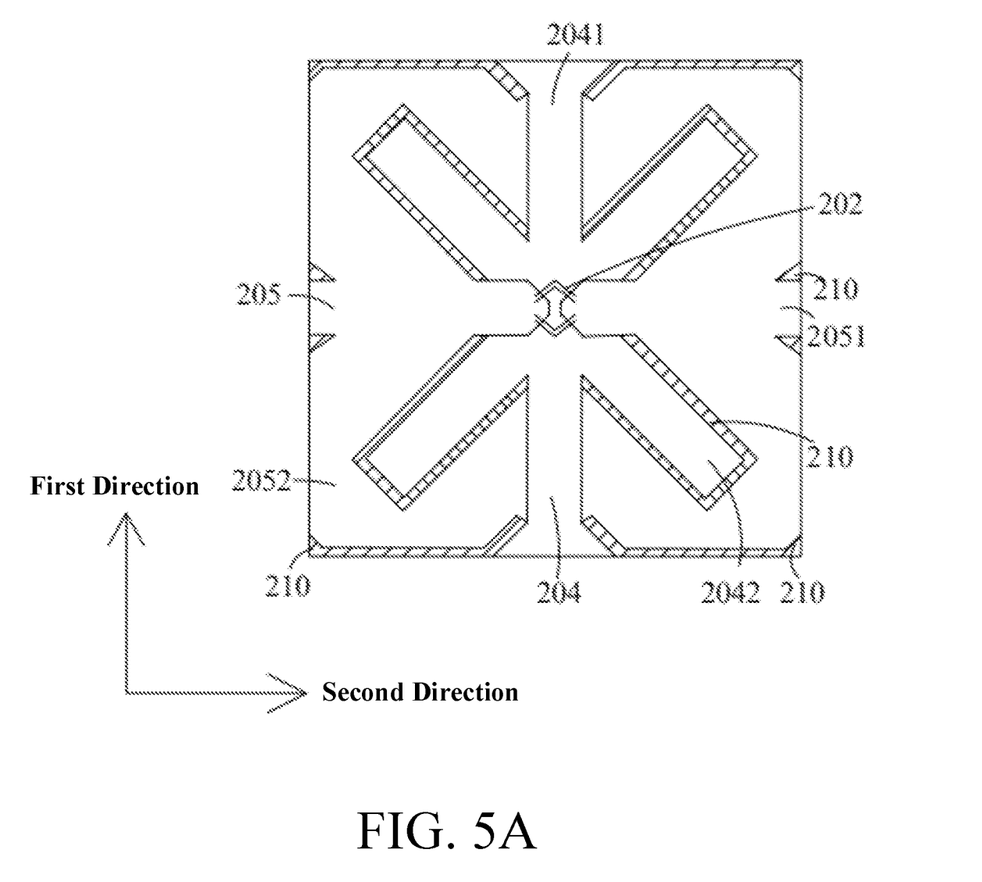
FIG. 5A is a schematic view of a touch unit 1 of the present invention.

With reference to FIG. 5A, FIG. 5A is a schematic view of touch unit 1 of the present invention. touch unit 1 comprises a driver electrode 204, induction electrodes 205 and a floating electrode 210. The driver electrode 204 comprises first trunk electrodes 2041 extending along a first direction and first branch electrodes 2042 extending out from the first trunk electrodes 2041, the two first branch electrodes 2042 extend out from intersection portions between the first trunk electrodes 2041 and the second trunk electrode 2051, and the two first branch electrodes 2042 are disposed symmetrically relative to the first trunk electrodes 2041. An included angle between each of the first branch electrodes 2042 and the first trunk electrodes 2041 is 45 degrees. A first connection portion is connected to the first trunk electrodes 2041. The first connection portion is disposed on the same layer with the two first trunk electrodes 2041, and the driver electrode 204, the induction electrodes 205, and the first connection portion are disposed on the same layer. The two first trunk electrodes 2041 are disposed symmetrically relative to the second trunk electrode 2051. Each of the induction electrodes 205 comprises a second trunk electrode 2051 extending along a second direction and second branch electrodes 2052 extending out from the second trunk electrode 2051. Each of the second branch electrodes 2052 surrounds one of the first branch electrodes 2042 adjacent to the second branch electrodes 2052. The induction electrodes 205 are disposed symmetrically relative to the first trunk electrodes 2041 and the second trunk electrode 2051. The two second trunk electrodes 2051 are electrically connected to each other through a second connection portion 202. The second connection portion 202 and the driver electrode 204 are in different layers. The first trunk electrodes 2041 and the second trunk electrode 2051 are both rectangles. A portion of the floating electrode 210 are disposed between the first branch electrodes 2042 surrounded by each second branch electrode 2052 and the second branch electrode 2052. A portion of the floating electrode 210 is disposed along two opposite edges of the second trunk electrode 2051 parallel to the second direction. A portion of the floating electrode 210 is disposed along the first direction in a region commonly enclosed by the second branch electrodes 2052 of adjacent two of the touch units and the first trunk electrodes 2041 such that adjacent two of the second branch electrodes 2052 along the first direction are electrically insulated from each other. The floating electrode 210 is electrically insulated from the driver electrode 204 and the induction electrodes 205. In the touch unit 1, a width of the metal wires of the metal meshes constituting the driver electrode 204, the induction electrodes 205, and the floating electrode 210 is 3.5 microns.

Figure 5B:
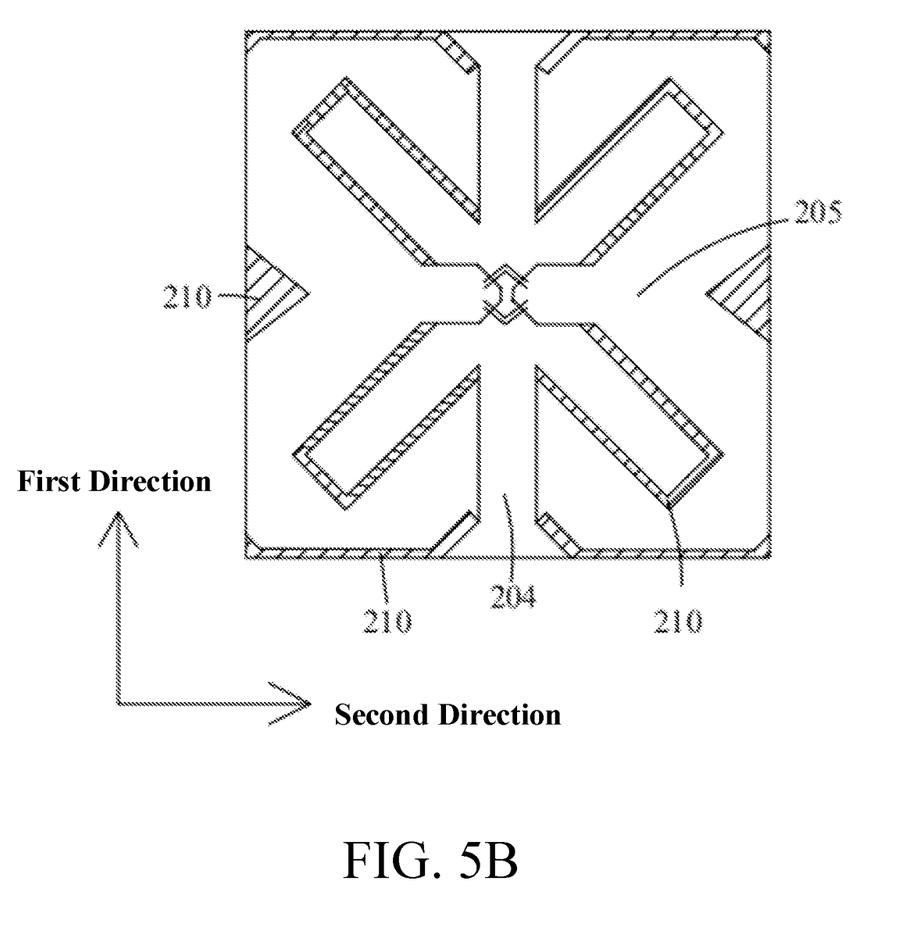
FIG. 5B is a schematic view of a touch unit 2 of the present invention.

With reference to FIG. 5B, FIG. 5B is a schematic view of a touch unit 2 of the present invention. The touch unit 2 is basically similar to the touch unit 1, and a difference is that a floating electrode 210 is disposed on the second trunk electrode 2052 of the touch unit 2, and the floating electrode 210 disposed on the second trunk electrode 2052 is formed continuously with the floating electrode 210 disposed along the two opposite edges of the second trunk electrode 2052 parallel to the second direction. Compared to the touch unit 1, an area of the floating electrode 210 of the touch unit 2 is increased, and an area of the induction electrodes 205 is decreased.

The touch unit 3 is basically similar to touch unit 1, a difference is that the floating electrode 210 in the touch unit 3 is only disposed among the first branch electrodes 2042 surrounded by the second branch electrodes 2052 and the second branch electrodes 2052, and a wire width of the metal wires of the metal meshes is 3 microns. Compared to the touch unit 1, the area of the floating electrode 210 of the touch unit 3 is decreased, the metal area of the touch unit is decreased, the area of the driver electrode 204 approximates to the area of the induction electrodes 205.

Figure 5C:
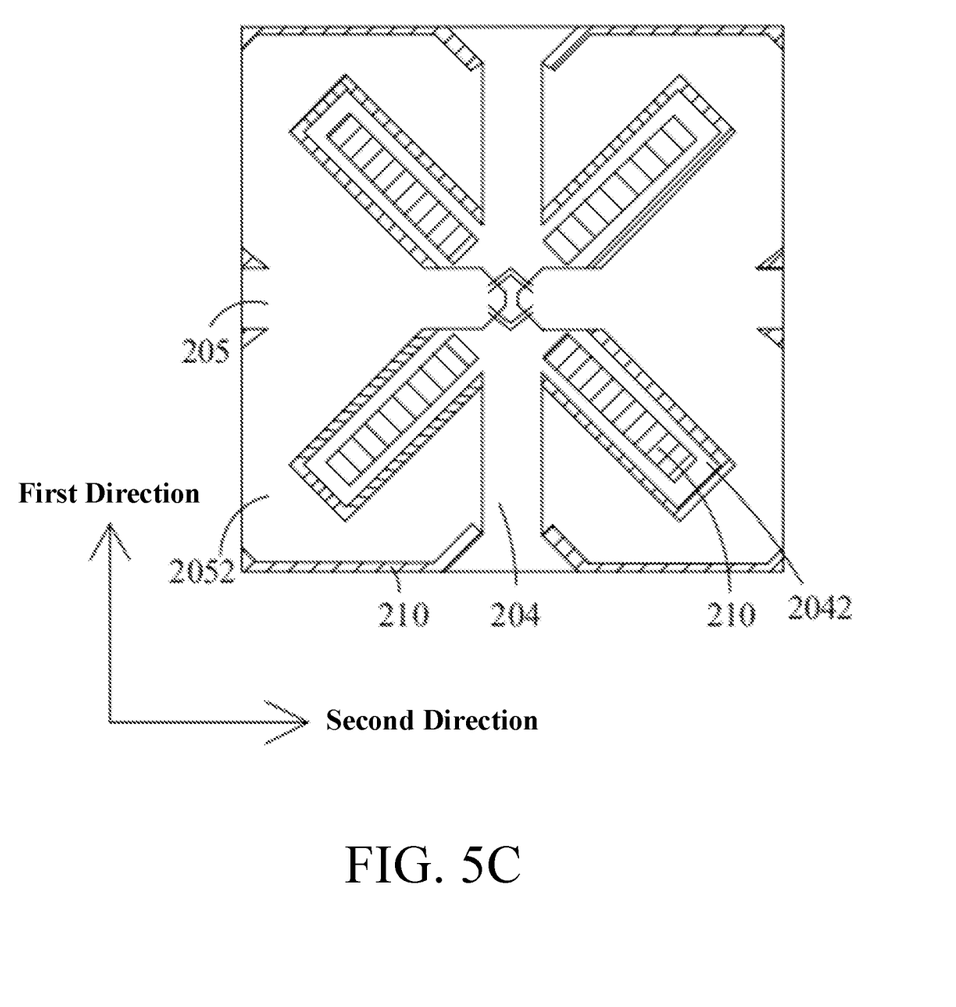
FIG. 5C is a schematic view of a touch unit 4 of the present invention.

With reference to FIG. 5C, FIG. 5C is a schematic view of a touch unit 4 of the present invention. The touch unit 4 is basically similar to the touch unit 1, and a difference is that a floating electrode 210 is disposed in the first branch electrodes 2042 of the touch unit 4, a wire width of the metal wires of the metal meshes is 3.6 microns.

Figure 5D:
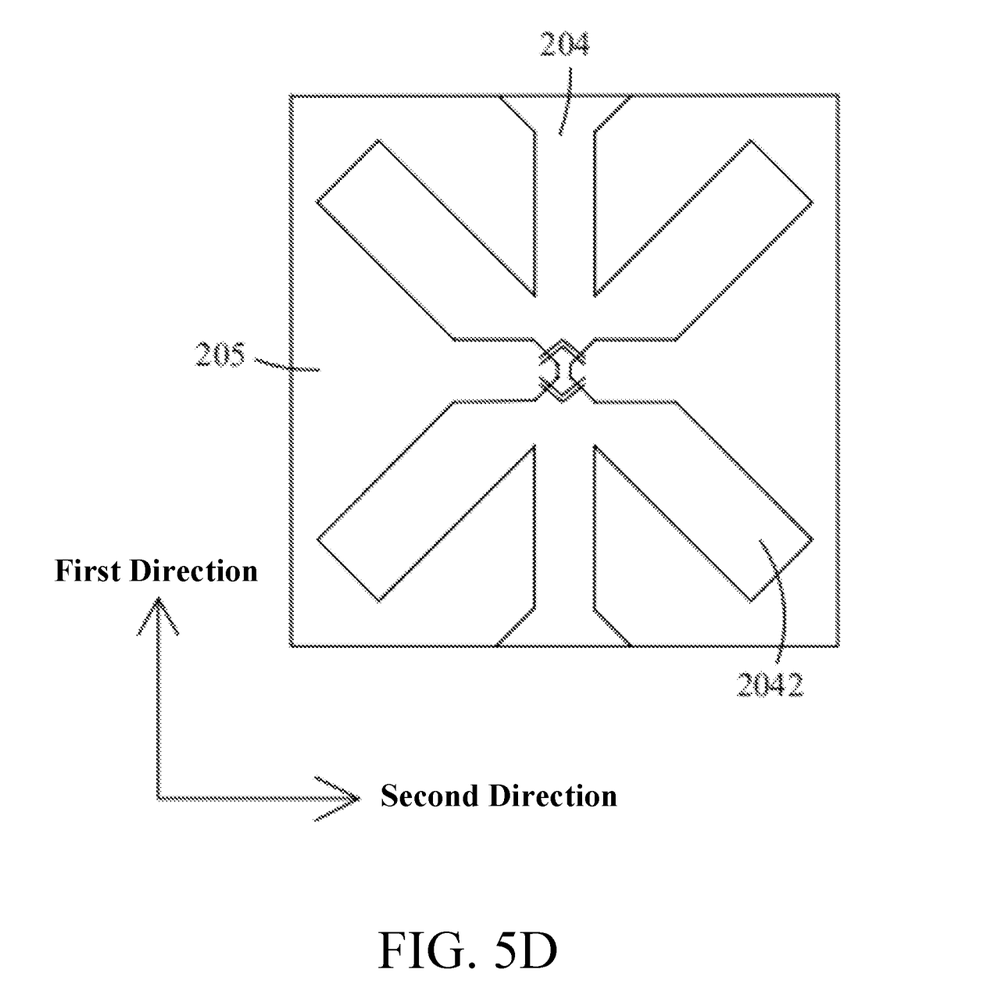
FIG. 5D is a schematic view of a touch unit 5 of the present invention.

With reference to FIG. 5D, FIG. 5D is a schematic view of a touch unit 5 of the present invention. The touch unit 5 is basically similar to the touch unit 1, and a difference is that the touch unit 5 includes no floating electrode 210, and a percentage of the metal area of the driver electrode 204 to the metal area of each of the touch units is greater than a percentage of the metal area of the induction electrodes 205 to the metal mesh of each of the touch units.

Figure 5E:
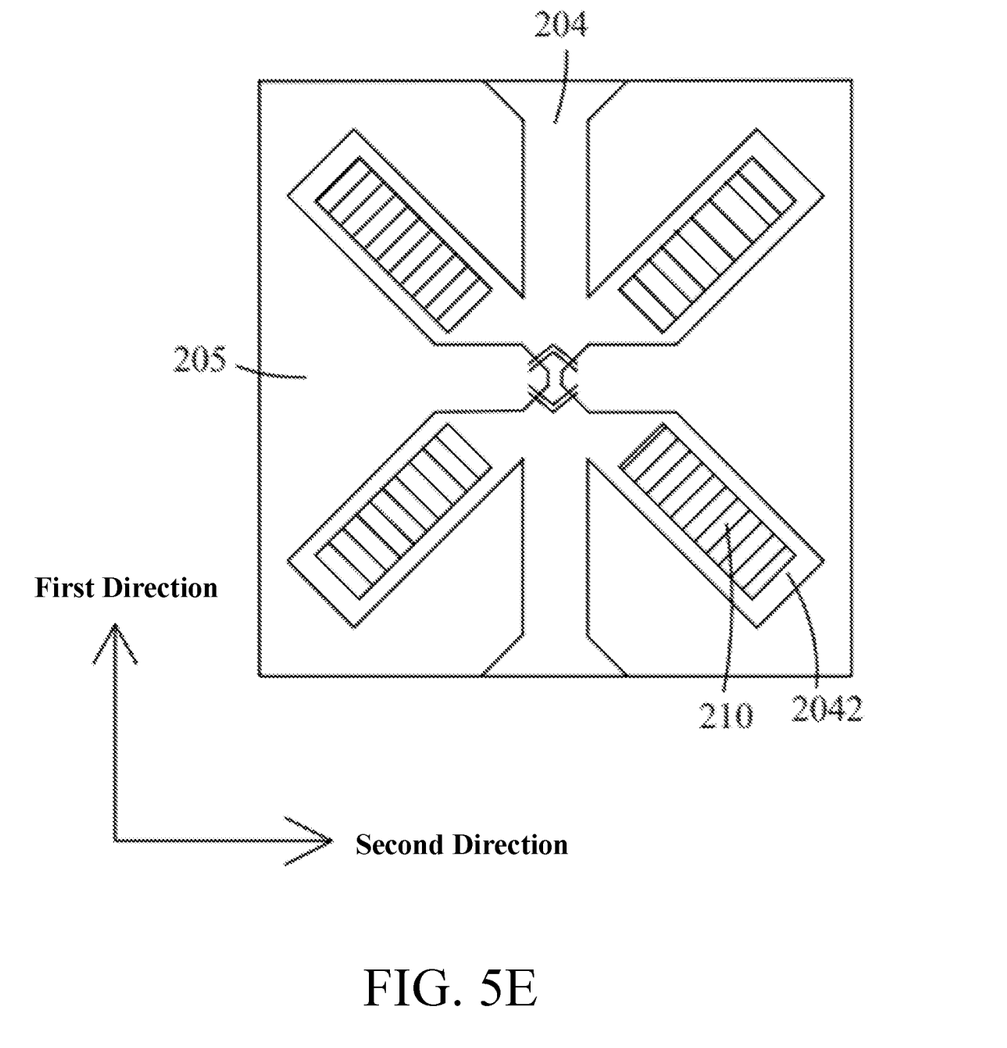
FIG. 5E is a schematic view of a touch unit 6 of the present invention.

With reference to FIG. 5E, FIG. 5E is a schematic view of a touch unit 6 of the present invention. The touch unit 6 is basically similar to the touch unit 1, a difference is that the induction electrodes 205 in the touch unit 6 is without the floating electrode 210, and more floating electrode 210 is disposed in first branch electrodes 2042 of the touch unit 6.

The touch unit 7 is basically similar to the touch unit 1, and a difference is that a percentage of the metal area 204 of the driver electrode is reduced, and the percentage of the metal area of the induction electrodes 205 is increased.

The touch unit of the comparison embodiment 1 is basically similar to the touch unit 1 and a difference is that in the comparison embodiment 1, a wire width of metal wires of each metal meshes is 3.7 microns. Compared to the touch unit 1, a width of metal wires of the metal meshes of the comparison embodiment 1 is greater.

Simulation data of the touch unit 1-7 of the present invention and comparison embodiment 1 is as the following Table 1.

TABLE 1

|  | touch unit 1 | touch unit 2 | touch unit 3 | touch unit 4 | touch unit 5 | touch unit 6 | touch unit 7 | Ratio 1 |
| --- | --- | --- | --- | --- | --- | --- | --- | --- |
| Size of a touch unit (millimeters × millimeters) | 3.977 × 3.977 | 4.159 × 4.159 | 3.977 × 3.977 | 3.977 × 3.977 | 3.977 × 3.977 | 3.977 × 3.977 | 3.977 × 3.977 | 3.977 × 3.977 |
| Smetal-all/Stotal | 13% | 17% | 8% | 21.5% | 13.5% | 13% | 13% | 27% |
| Stx/Smetal-all | 37% | 36.5% | 45% | 30% | 62% | 24% | 25% | 37% |
| Srx/Smetal-all | 46% | 43% | 46% | 51.5% | 38% | 48% | 58% | 46% |
| Sdummy/Smetal-all | 17% | 20.5% | 9% | 18.5% | 0% | 28% | 17% | 17% |
| C(picofarad, pf) | 0.8 | 0.85 | 0.7 | 0.92 | 1.1 | 0.88 | 0.75 | 1.4 |
| ΔC(picofarad, pf) | 0.06 | 0.072 | 0.046 | 0.075 | 0.065 | 0.055 | 0.05 | 0.082 |
| 3RC time constant (microsecond) | 1.25 | 1.326 | 1.414 | 1.416 | 1.485 | 1.625 | 1.1 | 2.121 |
| Self-capacitance time consumption (microsecond) | 520 | 520 | 520 | 520 | 520 | 520 | 520 | 520 |
| Self-capacitance-mutual-capacitance switching time (microsecond) | 102 | 102 | 102 | 102 | 102 | 102 | 102 | 102 |

TABLE 1-continued

|  | touch unit 1 | touch unit 2 | touch unit 3 | touch unit 4 | touch unit 5 | touch unit 6 | touch unit 7 | Ratio 1 |
|---|---|---|---|---|---|---|---|---|
| Mutual capacitance time consumption (microsecond) | 2380.8 | 2545.92 | 2714.88 | 2718.72 | 2851.2 | 3120 | 2112 | 4072.32 |
| Reset time consumption (microsecond) | 1000 | 1000 | 1000 | 1000 | 1000 | 1000 | 1000 | 1000 |
| Total time consumption (microsecond) | 4002.8 | 4167.92 | 4336.88 | 4340.72 | 4473.2 | 4742 | 3734 | 5694.32 |
| Touch report rate (Hz) | 250 | 240 | 230 | 230 | 223 | 210 | 268 | 175 |

As the above Table 1, Smetal-all refers to a metal area in each of the touch units metal meshes, Stotal refers to an area of each of the touch units, Stx refers to a metal area of the driver electrode in each of the touch units, Srx refers to a metal area of the induction electrodes in each of the touch units, C refers to a mutual capacitance of each of the touch units, ΔC refers to a capacitance variation of each of the touch units, 3RC time constant refers to a longest time required for a node mutual capacitance charged to 95% of an input voltage when the touch framework in FIG. is employed.

According to Table 1, a touch report rate of each of the touch unit 1-7 of the present invention is greater than a touch report rate of the comparison embodiment 1, and the touch report rate of each of the touch unit 1-7 of the present invention is greater than or equal to 210 Hz. A maximum touch report rate can reach 268 Hz. When the touch report rate is greater than or equal to 240 Hz, a scan square wave frequency outputted by a corresponding touch chip is greater than 350 KHz. A reason of the touch report rate of each of the touch unit 1-7 of the present invention being greater than the touch report rate of the touch units of the comparison embodiment 1 is that when the same touch framework is employed and the reset time consumption, the self-capacitance-mutual-capacitance switching time consumption, and the self-capacitance time consumption are the same, a ratio of the metal area of the metal meshes in each of the touch units 1-7 to the touch unit is less than a ratio of the metal area of the metal meshes in each of the touch units to the touch unit such that the parasitic capacitance of the touch units 1-7 is less than the parasitic capacitance of the touch units of the comparison embodiment 1. During charging the node mutual capacitance while the parasitic capacitance is charged simultaneously, when the parasitic capacitance becomes greater, the node mutual capacitance is charged to fulfill electrical signal inspection, for example, the longer a scan time required to fulfill the 3RC time constant, the longer a corresponding time consumption of a frame of touch. Therefore, a corresponding touch report rate would be lowered. According to the touch unit 1-7, with progressive increase of the metal area of the touch unit 1-7, an overall trend of the mutual capacitance between the driver electrode and the induction electrodes is progressive increase, and an overall trend of a capacitance variation is progressive increase, the progressive increase of the capacitance variation improves touch sensitivity. According to the touch unit 5 and touch unit 1, the touch unit 5 without a floating electrode can enhance the mutual capacitance and the capacitance variation of the touch unit to improve touch sensitivity. However, a greater parasitic capacitance of the driver electrode and the induction electrodes in the touch unit 5 would cause a longer time required for the node mutual capacitance charged to a voltage being 95% of the input voltage, which results in a lowered touch report rate. According to the touch unit 1 and the touch unit 6, the metal area of the floating electrode is increased, and the metal area of the floating electrode is greater than the metal area of the driver electrode, which results in decrease of the metal areas of the driver electrode and the induction electrodes to cause decrease of the capacitance variation to lower the touch sensitivity. According to the touch unit 1 and the touch unit 7, a reduced percentage of the metal area of the driver electrode advantages decreasing the parasitic capacitance of the driver electrode such that the scan time of the driver electrode is shortened to reduce the 3RC time constant of the node mutual capacitance and improve the touch report rate.

The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A touch display device, wherein the touch display device comprises an organic light emitting diodes display panel and a touch assembly, the organic light emitting diodes display panel comprises a common cathode and an encapsulation layer, the touch assembly comprises a touch layer, the encapsulation layer is located between the common cathode and the touch layer, the touch layer comprises a plurality of touch units arranged in an array, each of the touch units is constituted by metal meshes, in each of the touch units, a percentage of a metal area of the metal meshes to an area of each of the touch units is greater than 0% and is less than or equal to 25%;

each of the touch units comprises a driver electrode, induction electrodes and a floating electrode, the driver electrode is electrically insulated from the induction electrodes, the floating electrode is electrically insulated from both the driver electrode and the induction electrodes, the floating electrode is dispose in the driver electrode and/or the induction electrodes, and/or, the floating electrode is disposed between the driver electrode and the induction electrodes;

in each of the touch units,
- a percentage of a metal area of the driver electrode to a metal area of each of the touch units is greater than 0% and is less than or equal to 60%;
- a percentage of a metal area of the induction electrodes in the metal area of each of the touch units is greater than or equal to 40% and is less than 100%; and
- a percentage of a metal area of the floating electrode to the metal area of each of the touch units is greater than or equal to 0% and is less than or equal to 25%.

2. The touch display device as claimed in claim 1, wherein in each of the touch units, a percentage of a metal area of the metal meshes to an area of each of the touch units is greater than or equal to 10% and is less than or equal to 22%.

3. The touch display device as claimed in claim 1, wherein in each of the touch units,
- a percentage of the metal area of the driver electrode to the metal area of each of the touch units is greater than or equal to 5% and is less than or equal to 60%;
- a percentage of the metal area of the induction electrodes to the metal area of each of the touch units is greater than or equal to 40% and is less than 80%; and
- a percentage of a metal area of the floating electrode to the metal area of each of the touch units is greater than 0% and is less than or equal to 25%.

4. The touch display device as claimed in claim 1, wherein in each of the touch units,
- a percentage of the metal area of the driver electrode to the metal area of each of the touch units is greater than or equal to 25% and is less than or equal to 55%;
- a percentage of the metal area of the induction electrodes to the metal area of each of the touch units is greater than or equal to 40% and is less than or equal to 70%;
- a percentage of the metal area of the floating electrode to the metal area of each of the touch units is greater than or equal to 5% and is less than or equal to 25%.

5. The touch display device as claimed in claim 1, wherein in each of the touch units, a percentage of the metal area of the driver electrode to the metal area of each of the touch units is less than a percentage of the metal area of the induction electrodes to the metal area of each of the touch units.

6. The touch display device as claimed in claim 1, wherein in each of the touch units, a percentage of a metal area of the floating electrode to the metal area of each of the touch units is less than a percentage of the metal area of the driver electrode to the metal area of each of the touch units.

7. The touch display device as claimed in claim 1, wherein in each of the touch units, a metal area of the floating electrode disposed between the driver electrode and the induction electrodes is less than a metal area of the floating electrode disposed in the driver electrode and/or in the induction electrodes.

8. The touch display device as claimed in claim 1, wherein
- the driver electrode comprises first trunk electrodes extending along a first direction and first branch electrodes extending out from the first trunk electrodes;
- in each of the touch units, a ratio of a metal area of the first trunk electrodes to a metal area of the first branch electrodes is 1/2 to 2; and/or
- each of the induction electrodes comprises a second trunk electrode extending along a second direction and second branch electrodes extending out from the second trunk electrode; and
- in each of the touch units, a ratio of a metal area of the second trunk electrodes to a metal area of the second branch electrodes is 1/2 to 2, and the first direction is different from the second direction.

9. The touch display device as claimed in claim 1, wherein in each of the touch units, a capacitance variation of a mutual capacitance of a node between the driver electrode and the induction electrodes is greater than or equal to 40 femtofarads.

10. The touch display device as claimed in claim 1, wherein in each of the touch units, a time required for a mutual capacitance of a node between the driver electrode and the induction electrodes charged to reach a predetermined voltage is less than or equal to a predetermined duration.

11. The touch display device as claimed in claim 10, wherein
- the touch assembly further comprises a touch chip, the touch chip is electrically connected to the driver electrode and the induction electrodes, and the touch chip is configured to input an input voltage into the driver electrode; and
- a percentage of the predetermined voltage to the input voltage 90%-99%, the predetermined duration is 1 microsecond to 2 microseconds.

12. The touch display device as claimed in claim 11, wherein a percentage of the predetermined voltage to the input voltage 95%.

13. The touch display device as claimed in claim 11, wherein the predetermined duration is 1 microsecond to 1.5 microsecond.

14. The touch display device as claimed in claim 1, wherein a distance between the touch layer and the common cathode is greater than or equal to 5 microns and is less than or equal to 15 microns.

15. The touch display device as claimed in claim 1, wherein a distance between the touch layer and the common cathode is greater than or equal to 8 microns and is less than or equal to 12 microns.

16. The touch display device as claimed in claim 1, wherein each of the touch units is a square, a side length of each of the touch units is greater than or equal to 3.5 millimeters and is less than or equal to 4.5 millimeters.

* * * * *